United States Patent [19]

Savla

[11] Patent Number: 4,712,005
[45] Date of Patent: Dec. 8, 1987

[54] FLOATING MASK ENCODER WITH ASSEMBLY SPACER

[75] Inventor: Lalit J. Savla, Nesconset, N.Y.

[73] Assignee: Kollmorgen Technologies Corporation, Dallas, Tex.

[21] Appl. No.: 810,605

[22] Filed: Dec. 19, 1985

[51] Int. Cl.$^4$ .............................................. G01D 5/34
[52] U.S. Cl. ......................... 250/231 SE; 250/237 G
[58] Field of Search ............ 250/231 SE, 237 G, 239; 340/347 P; 356/39 S; 33/125 C

[56] References Cited

U.S. PATENT DOCUMENTS

| | | | |
|---|---|---|---|
| 3,524,261 | 8/1970 | Klink | 332/174 |
| 3,545,088 | 12/1970 | Johnson | 33/174 |
| 3,997,782 | 12/1976 | Willits | 250/239 |
| 4,075,478 | 2/1978 | Walker | 250/231 SE |
| 4,132,890 | 1/1979 | Garcia et al. | 250/231 SE |
| 4,184,071 | 1/1980 | Fryer et al. | 250/237 G |
| 4,193,199 | 3/1980 | Whiteley et al. | 250/231 SE |
| 4,319,134 | 3/1982 | Weber | 250/239 |
| 4,338,517 | 7/1982 | Perrine | 250/231 SE |
| 4,343,992 | 8/1982 | Blaser | 250/231 SE |
| 4,345,149 | 8/1982 | Blaser | 250/231 SE |
| 4,375,592 | 3/1983 | Cox et al. | 250/231 SE |
| 4,476,457 | 10/1984 | Kondo | 340/347 F |
| 4,512,184 | 4/1985 | Ernst et al. | 250/231 SE |
| 4,556,792 | 12/1985 | Kano et al. | 250/237 G |
| 4,614,869 | 9/1986 | Hoshino et al. | 250/237 G |

FOREIGN PATENT DOCUMENTS 0170576  2/1976  European Pat. Off. .

Primary Examiner—David C. Nelms
Attorney, Agent, or Firm—Morgan & Finnegan

[57] ABSTRACT

In an optical shaft encoder for converting rotary motion to an electrical signal, a shaft is rotatably mounted in a base and has a code disk attached thereto. A light source and photodetector are disposed on opposite sides of the code disk. The photodetector is covered by a mask which is attached thereto. The photodetector/mask assembly is loosely inserted into a printed circuit board and a spacer is placed between the code disk and the photodetector/mask assembly to achieve a predetermined air gap. The photodetector/mask assembly is then radially aligned with the code disk. After proper placement, the photodetector/mask assembly is soldered in place and the spacer is removed. This technique allows the optical shaft encoder to be manufactured to precise tolerances without the necessity of precision machining.

8 Claims, 4 Drawing Figures

FLOATING MASK ENCODER WITH ASSEMBLY SPACER

BACKGROUND OF THE INVENTION

1. Field of the Invention

The present invention relates generally to optical shaft encoders and, more specifically, to a method of manufacturing an optical shaft encoder with a minimum of precision machining.

2. Description of the Prior Art

Optical shaft encoders typically include a rotating code disk coupled to a shaft and convert the rotary position to a digital output signal. The code disk includes predetermined opaque and transparent patterns or lines disposed about the circumference. The code disk rotates between a light source and a photodetector. A mask is disposed between the code disk and the photodetector, such that as the code disk rotates, light from the light source is alternately blocked and transmitted through the code disk and mask. The light which transmitted through the code disk and mask strikes the photodetector. The photodetector generates electrical output signals indicative of the position of the rotating code disk and the shaft to which it is coupled.

The assembly and installation of optical shaft encoders must be done within precise tolerances. Otherwise misalignments cause distortions in the output signals of the optical shaft encoder. The alignment problem can be reduced by using more precisely machined components. Precision machining, however, greatly increases the manufacturing costs. Several patents have addressed the alignment problems associated with the manufacture and installation of optical shaft encoders.

U.S. Pat. No. 4,345,149 discloses an optical shaft encoder having a mounting support which carries the light source. The optical encoder assembly is centered on a motor casing with respect to the motor shaft by a disc-shaped centering fixture. The fixture has a central bore of a diameter corresponding to the dimater of the motor shaft, and an annular peripheral downwardly depending lip at a precise radial distance corresponding to the radial distance between the geometrical center of the mounting support and its circular periphery. The disc-shaped fixture can overlie the mounting support with its lip engaged about the periphery with its central bore receiving the motor shaft. The geometry is such that the mounting support is necessarily held in a precise concentric relationship with respect to the motor shaft by means of the centering fixture. The mounting support can then be secured to the motor casing itself and thereafter the centering fixture removed.

U.S. Pat. No. 4,184,071 discloses a modular encoder with a dimensionally stable housing which can be easily aligned for mounting on a motor housing. The encoder utilizes a monolithic, in-line, sensor array and a single light source to achieve improved long-term performance and includes improved alignment permitting rapid alignment of the encoder with a motor. Pre-alignment of the mask and sensor assembly simplifies the alignment performed by the user.

U.S. Pat. No. 4,075,478 discloses an optical encoder design which maintains a constant fixed air gap between the commutator and light sensors. The encoder head is mounted on a partially compressed hollow bellows or other spring member biasing snubber posts adjacent to the light sensors against tracks on the commutator. The height of the snubber posts above the light sensors defines the air gap.

All of above described patents are directed towards alignment problems, but none of the patents reduce the expensive and time consuming precision machining requirements for an optical shaft encoder. Accordingly, there is a need for a method of manufacturing an optical shaft encoder that reduces the precision machining requirements and simplifies the alignment problems.

SUMMARY OF THE INVENTION

The present invention provides a method of manufacturing an optical shaft encoder that requires a minimum of precision machining and simplifies the alignment problems. The photodetector/mask assembly is aligned relative to the code disk using a spacer or shim and then soldered in place to thereby eliminate precise machining tolerances.

The optical shaft encoder includes a shaft that is journaled upon ball bearings within a base. A code disk having alternating transparent and opaque patterns or lines is attached to a machined hub on the shaft. A light source is mounted on the base and radiates light which is transmitted through the transparent portions of the rotating disk. A substrate, such as a printed circuit board, is atatched to the base. A photodetector/mask assembly with straight connecting leads is mounted on the printed circuit board with the leads passing through suitable apertures in the board. Prior to the photodetector/mask assembly being soldered to the printed circuit board, a spacer or shim having a predetermined width of approximately 0.003" is placed between the photodetector/mask assembly and the code disk. The shim is used to accurately align the mask with the code disk already in place. The connecting leads are then soldered in place to fix the position of the mask. When the spacer or shim is removed the clearance and alignment between the mask and disk is fixed. Since the mask position is set by soldering leads of the photodetector/mask assembly when aligned by the spacer or shim, a minimum of precision machining is required to achieve the necessary spacing and alignment between the code disk and photodetector/mask assembly.

DETAILED DESCRIPTION OF THE INVENTION

Figure 1:
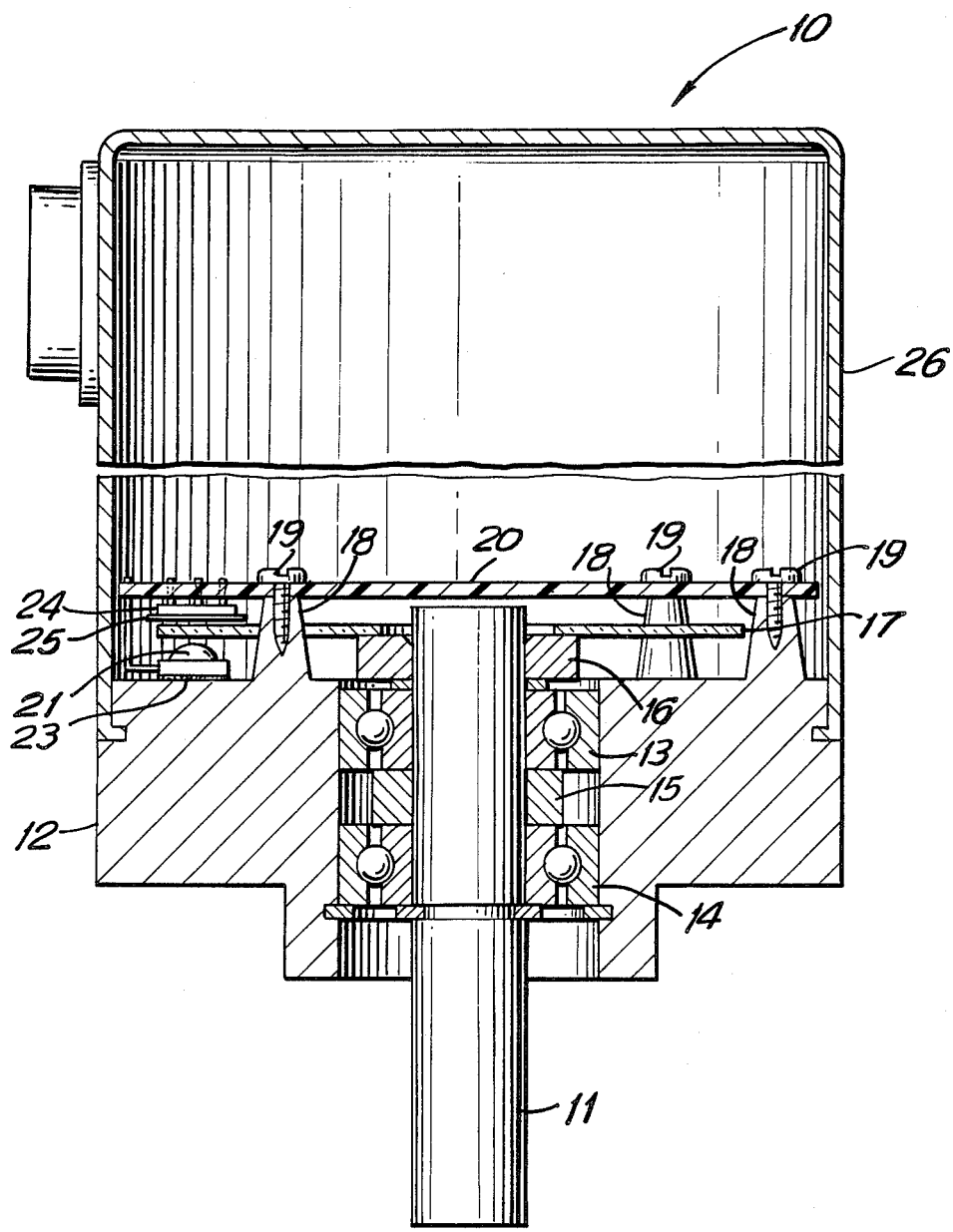
FIG. 1 is a cross sectional view of an optical shaft encoder.

Referring now to FIG. 1, a cross sectional view illustrates an optical shaft encoder 10 fabricated in accordance with the teachings of the present invention. The present invention is described in the context of an optical shaft encoder, but the invention is equally applicable to shaft encoders which use magnetic, capacitive or conductive techniques.

The optical shaft encoder includes a shaft 11 which is journaled within a base 12 upon bearings 13, 14. Bearings 13 and 14 are separated by a spacer 15. Shaft 11 is attached to a hub 16. The shaft and hub may be fabricated as an integral assembly. Hub 16 is preferably machined to have a precise flat upper surface upon which a code disk 17 is mounted. The code disk is generally a thin transparent disk with a pattern of radially extending opaque lines thereon. The present invention is well adapted for use with high resolution code disks having over five thousand such lines.

Base 12 preferably includes standoffs 18 upon which a substrate such as a printed circuit board 20 is mounted. Screws 19 secure the printed circuit board to the standoffs 18. A light source such as a light emitting diode (LED) 21 is attached to the base 12 by an adhesive 23. Directly above LED 21, a photodetector 24 and a mask 25 are attached to printed circuit board 20 in a fashion hereinafter described in greater detail. Mask 25 is similar to a small segment of code disk 17 and includes a plurality of transparent areas and opaque lines. The mask covers photodetector 24 and is attached thereto by suitable transparent adhesives. Code disk 17 rotates between LED 21 and photodetector 24. Base 12 is enclosed by a cover 26.

In the optical encoder 10, the surfaces of code disk 17 and mask 25 must be maintained extremely parallel with an air gap of less than 0.005" for good accuracy. The mask must also be adjusted radially in relation to the code disk for proper output.

In prior systems, the parallel spacing between the surface area of the mask and the code disk has been obtained by very tight machining tolerances (typically $+/-0.0001$) in the components that make up the optical shaft encoder. This is a very expensive operation. When these components are assembled, the tolerances are usually additive creating additional manufacturing problems. The present invention overcomes the manufacturing problems related to machining tolerances and radial alignment.

The present invention eliminates the expensive tight tolerance machining operations and yet achieves close to perfect radial and spacial alignment of the mask in relation to the code disk. According to the present invention, the shaft 11 is used as a reference. After the hub 16 is attached to the shaft (although shaft 11 and hub 16 could be unitary) the surface of the hub (the side which mates with code disk 17) is machined perpendicular to the shaft axis. This insures that after the code disk is assembled on to hub 16, its surface is perpendicular to the axis of shaft 11. This in turn insures that when shaft 11 is rotated, the surface of the code disk does not wobble.

Figure 2:
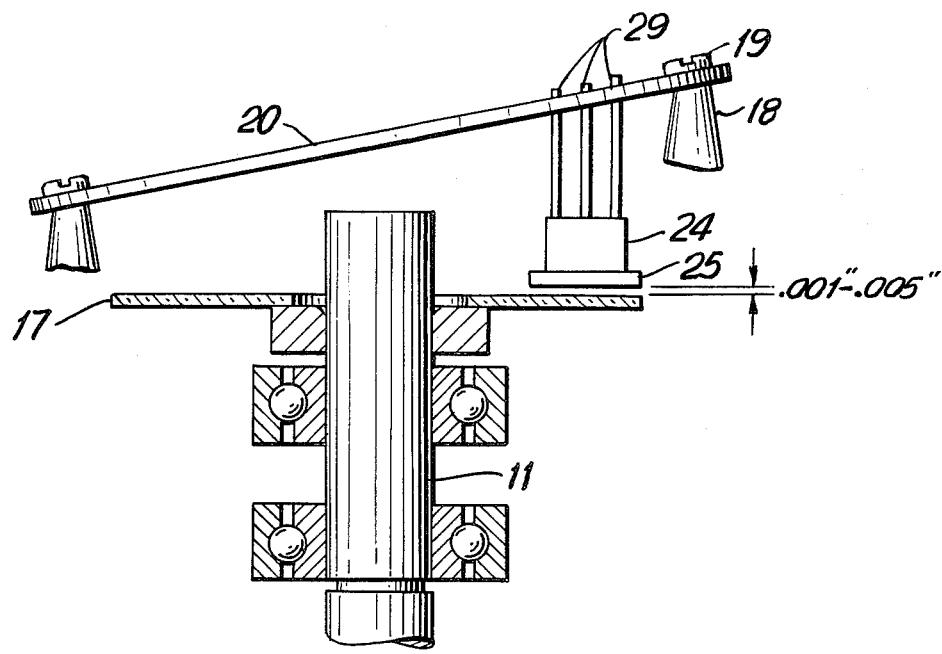
FIG. 2 is an exaggerated side view of the shaft, disk, and printed circuit board of an optical shaft encoder fabricated in accordance with the present invention.

Referring now to FIG. 2, printed circuit board 20 which includes the photodetector and mask assembly mounted thereon, is shown exaggerated at an angle to code disk 17 to illustrate that, in the present invention, precise alignment of the printed circuit board 20 and the code disk 17 is not necessary. Initially, the leads 29 to the photodetector 24 and the mask 25 assembly are loosely inserted into printed circuit board 20, and the photodetector/mask 25 assembly is relatively movable under the printed circuit board assembly. The photodetector/mask assembly is pushed down toward the code disk surface with an appropriate shim or spacer between the assembly and the disk.

Figure 3:
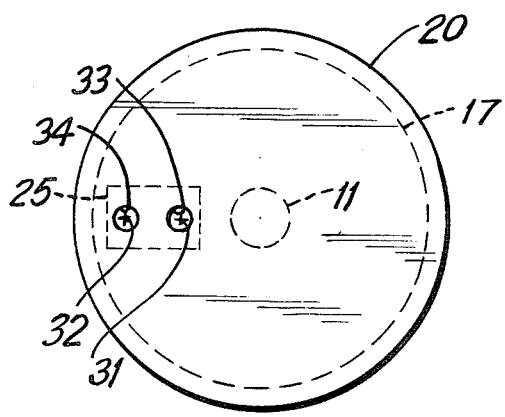
FIG. 3 is a plan view of the printed circuit board of the optical shaft encoder.
Figure 4:
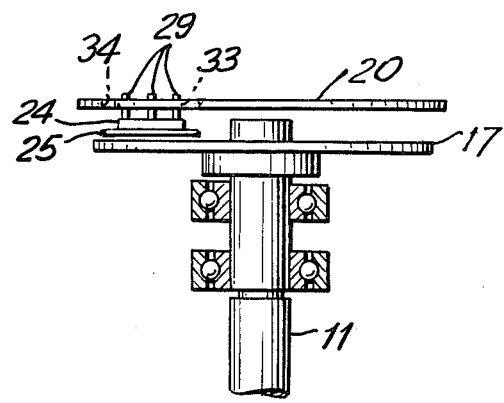
FIG. 4 is a side view of the assembly of FIG. 3.

At the same time that the spacer is inserted, the photodetector and mask assembly is radially aligned with code disk 17 as shown in FIG. 3 and 4. FIG. 3 is a plan view of printed circuit board 20, and FIG. 4 is a side view of the assembly of FIG. 3. Mask 25 contains two alignment marks 31 and 32. Also code disk 7 includes corresponding alignment marks 32. Two see-through holes 33, 34 in printed circuit board 20 enable the alignment marks 31, 32 to be positioned correctly beneath the printed circuit board 20. After correct positioning of the printed circuit board with the shim or spacer in place, photodetector leads 29 are soldered to printed circuit board 20 to secure the photodetector and mask in the properly aligned position..

Base 12, therefore, can be a casting made with minimal secondary precision machining operation. The position of the code disk 17 with respect to the base 12 is not critical. The position and orientation of the printed circuit board 20 with respect to the code disk 17 or base 12 is also not critical, as shown in FIG. 2. The relationship of these components make the optical shaft encoder 10 relatively easy and inexpensive to fabricate. After the photodetector and mask assembly is adjusted as discussed above, it can be fine adjusted if necessary at the final test by loosening the mounting screws 19 to the printed circuit board assembly 20.

The present invention has several advantages over prior art techniques for fabricating an optical shaft encoder. A very tight gap between the code disk 17 and mask 25 is possible without the expensive precision machining operations on the related components. Prealignment features of the mask 25 with the code disk 17 prevent the use of guesswork and saves time. The mask 25 is fixed in relation to the photocell array or photodetector 24. This arrangement eliminates the cross talk problems between the data tracks inherent in the prior art.

While the invention has been described in its preferred embodiments, it is to be understood that the words which have been used are words of description, rather than limitation, and that changes may be made within the purview of the appended claims without departing from the true scope and spirit of the invention in its broader aspects.

I claim:

1. A method of manufacturing a shaft position encoder requiring a minimum of precision machining and exhibiting simplified alignment characteristics and which is of the type including a rotary encoded disk including position markings thereon and a stationary detector having a mask disposed thereon for reading said position markings to produce electrical signals indicative of shaft position, comprising the steps of:

mounting the encoded disk for rotation with the shaft;

mounting a circuit board near the encoded disk;

placing the detector between the encoded disk and the circuit board with the leads thereof passing through apertures in the circuit board;

aligning the detector and the encoded disk with the surface of said mask and the surface of said disk in parallel with each other and with an air gap of less than 0.005" between their surfaces using a spacer between the detector and the encoded disk surface;

mechanically securing the detector leads to the circuit board with the spacer in place; and thereafter removing the spacer.

2. The method according to claim 1 wherein the detector leads are secured to the circuit board electrically and mechanically by soldering.

3. A method of manufacturing a transducer for converting rotary motion to an electrical signal which requires a minimum of precision machinging, exhibiting simplified alignment characteristics and which method comprises the steps of:

installing a rotatable shaft within a base;
mounting a disk upon the rotatable shaft;
mounting first sensing means on the base;
mounting a substrate to the base, the substrate having second sensing means loosely mounted thereon, such that the first and second sensing means are disposed on opposite sides of the disk;
placing spacing means between the second sensing means and the disk;
radially aligning the second sensing means with the disk; and
fixedly attaching the second sensing means to the substrate such that there is a predetermined air gap of less than 0.005" between the second sensing means and the disk when the spacing means is removed.

4. A method according to claim 3 which further includes the step of machining a hub disposed between the shaft and the disk.

5. A transducer for converting rotary motion to an electrical signal which requires a minimum of precision machining, exhibiting simplified alignment characteristics and which comprises:
a base;
a shaft rotatably mounted within said base;
a disk coupled to said rotatable shaft;
first sensing means mounted on said base and disposed on one side of said disk;
a substrate mounted on said base and disposed on the opposite side of said disk; and
second sensing means fixedly mounted on said substrate only after spacing means has been disposed between said second sensing means and said disk providing an air gap of less than 0.005" between said second sensing means and said disk and only after said second sensing means has been radially aligned with said disk.

6. A transducer according to claim 5 wherein said first sensing means includes a light source and said second sensing means includes a photodetector having a mask disposed thereon.

7. A transducer according to claim 6 wherein said substrate is a printed circuit board and said photodetector is coupled to said printed circuit board by a plurality of leads soldered to said printed circuit board.

8. A transducer according to claim 7 wherein said disk and said mask include alignment marks and said printed circuit board includes alignment holes.

* * * * *